(12) United States Patent
Carey et al.

(10) Patent No.: US 6,274,924 B1
(45) Date of Patent: Aug. 14, 2001

(54) SURFACE MOUNTABLE LED PACKAGE

(75) Inventors: Julian A. Carey, Sunnyvale; William D. Collins, III, San Jose; Ban Poh Loh, San Jose; Gary D. Sasser, San Jose, all of CA (US)

(73) Assignee: LumiLeds Lighting, U.S. LLC, San Jose, CA (US)

( * ) Notice: Subject to any disclaimer, the term of this patent is extended or adjusted under 35 U.S.C. 154(b) by 0 days.

(21) Appl. No.: 09/187,547

(22) Filed: Nov. 5, 1998

(51) Int. Cl.⁷ .................................................. H01L 23/495
(52) U.S. Cl. ............................................. 257/676; 257/98
(58) Field of Search ............................... 257/98, 99, 431, 257/676

(56) References Cited

U.S. PATENT DOCUMENTS 5,606,182 * 2/1997 Yoshida et al. ......................... 257/98
6,084,252 * 7/2000 Isokawa et al. ........................ 257/98

* cited by examiner

Primary Examiner—Roy Potter
(74) Attorney, Agent, or Firm—Skjerven Morrill MacPherson LLP; Brian D. Ogonowsky

(57) ABSTRACT

An LED package includes a heat-sinking slug that is inserted into an insert-molded leadframe. The slug may include an optional reflector cup. Within this cup, the LED and a thermally conducting sub-mount may be attached. Wire bonds extend from the LEDs to metal leads. The metal leads are electrically and thermally isolated from the slug. An optical lens may be added by mounting a pre-molded thermoplastic lens and a soft encapsulant or by casting epoxy to cover the LED or by a cast epoxy lens over a soft encapsulant.

28 Claims, 2 Drawing Sheets

SURFACE MOUNTABLE LED PACKAGE

FIELD OF THE INVENTION

The present invention is directed towards the field of packaging light emitting diodes.

BACKGROUND OF THE INVENTION

Most light emitting devices (LEDs) emit incoherent light. One performance measure of an LED is photometric efficiency, e.g. the conversion of input energy into visible light. Photometric efficiency is inversely proportional to the junction temperature of the LED. A major concern of the LED package designer is keeping the die cool to provide good overall performance.

For low power LEDs, e.g.$\leq$200 mW, or die with small area, a large optical cavity size limits the ability to meet the desired reliability conditions. A smaller than optimum cavity size reduces the light extraction efficiency, e.g. the amount of generated light that exits the device. The prior art packages e.g. T1-3/4 and SnapLED, use cast epoxy as the hard encapsulant. The cast epoxy provides both optical and structural functionality. A prior art package design for an LED is shown in FIG. 1. The die is seated at the base of the optical cavity. A hard encapsulant, e.g. rigid unfilled epoxy, fills the optical cavity. Because the die, the optical cavity, and the encapsulant have different thermal coefficients, they expand and contract at different rates during operation. This places a high mechanical stress on the LED. In addition, the prior art packages lack thermal isolation between the electrical and the thermal paths because the electrical leads are the primary thermal paths. As a result, the packaged die are subject to thermal stresses from the temperature cycling, especially during assembly into end products.

These problems are exacerbated as the die increases in area or input power. Because a device having a larger junction area, e.g.>0.25 mm$^2$ requires a larger optical element than a small die, e.g.<<0.25 mm$^2$, to provide comparable light extraction efficiency, a large optical cavity is necessary. The mechanical stress applied to the LED increases with the volume of the encapsulant. In addition, the stress increases as the packaged LED is exposed to temperature cycling and high moisture conditions. The accumulated mechanical stresses reduce the overall LED reliability.

Since prior art packages use their electrical leads as primary thermal paths, the high thermal resistance of these paths combined with the high thermal resistance of the external system creates high junction temperatures, when power dissipation increases, e.g.$\geq$200 mW. High junction temperature contributes to accelerating the irreversible loss of photometric efficiency in the LED chip and also accelerates processes that contribute to the failure of mechanical integrity of the LED package.

None of the available LED packages provide reliable optically efficient operation for applications approaching LED average input power of 0.2 W, especially when operating under high (>35%) duty factors or long pulse widths>1 second.

SUMMARY OF THE INVENTION

The present invention is an LED package that has separate optical and structural functionality. A heat-sinking slug is inserted into an insert-molded leadframe. The insert-molded leadframe consists of a patterned metal part, overmolded by a filled plastic material to provide structural integrity. The slug may include an optional reflector cup. The LED die is mounted directly or indirectly via an electrically insulating and thermally conducting sub-mount to the slug. Bond wires extend from the LEDs to metal leads that are electrically and thermally isolated from the slug. An optical lens may be added by mounting a pre-molded optically transparent thermoplastic lens and a soft optically transparent encapsulant or by casting an optically transparent epoxy to cover the LED or by a cast optically transparent epoxy lens over soft optically transparent encapsulant. The soft optically transparent encapsulant is a soft material that provides low stress or cushioning to the LED die.

DETAILED DESCRIPTION OF THE DRAWINGS

Figure 1:
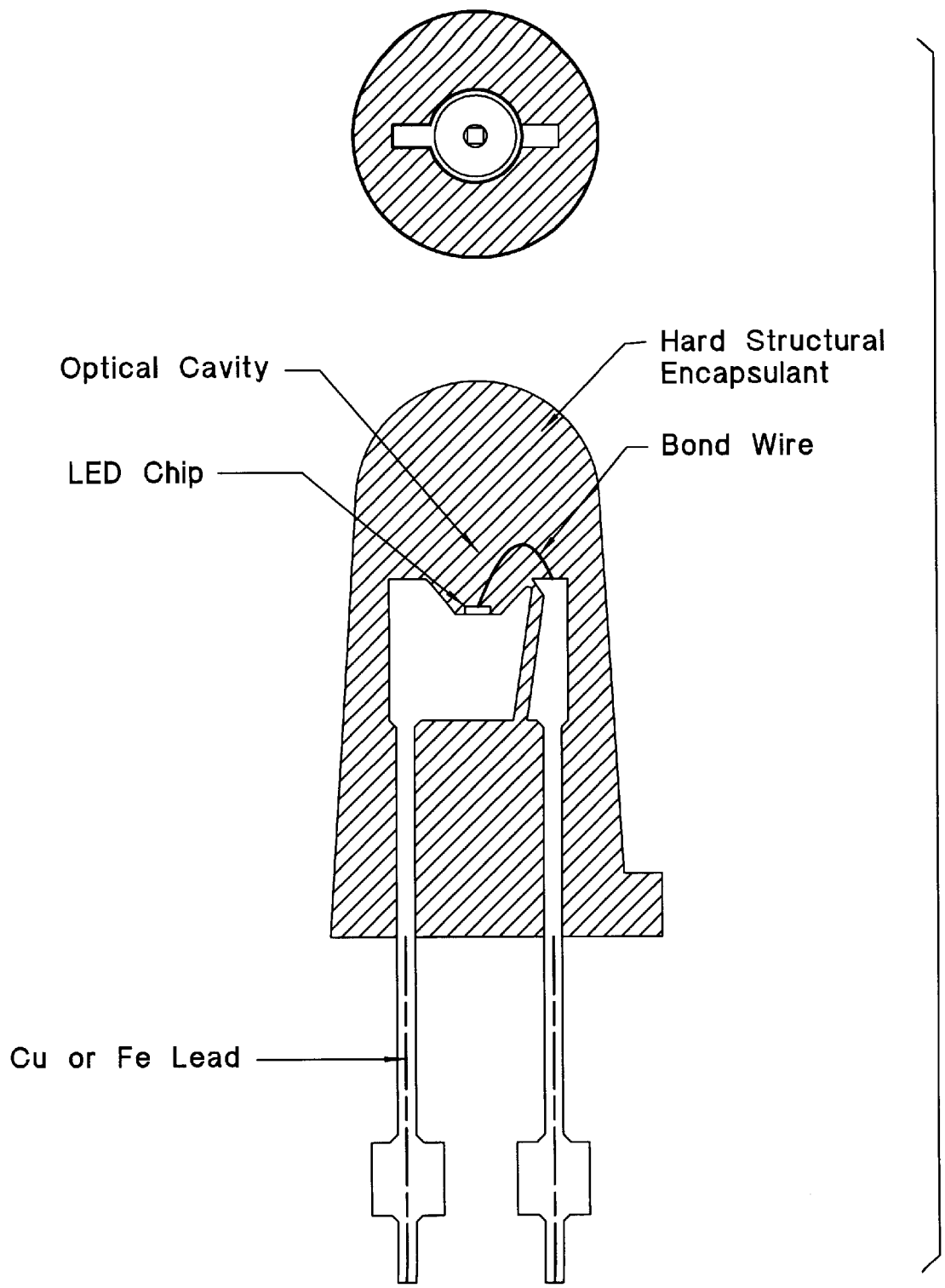
FIG. 1 illustrates a prior art LED assembly.
Figure 2:
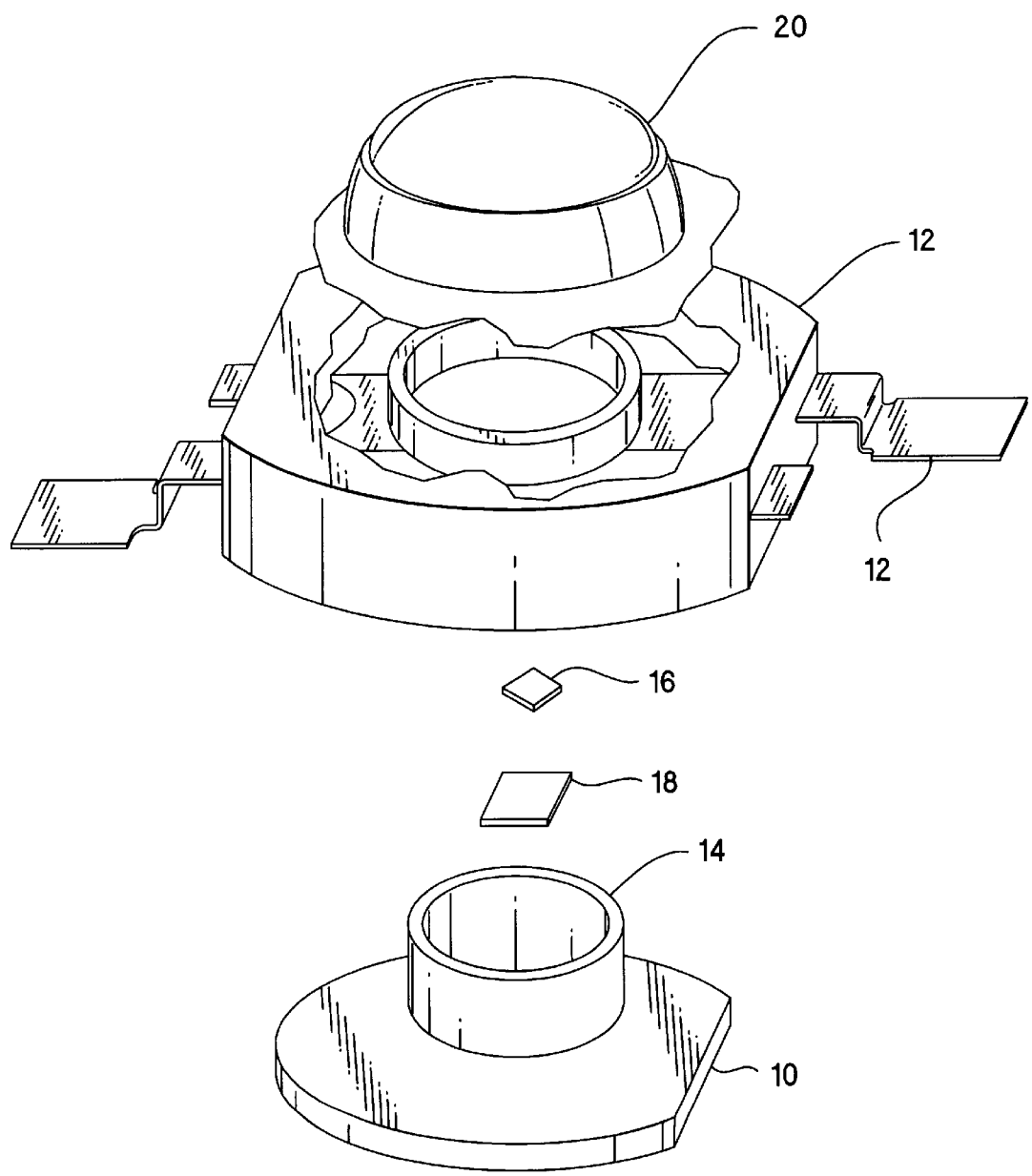
FIG. 2 illustrates an embodiment of the present invention.

FIG. 2 illustrates an embodiment of the present invention, an LED package that has decoupled optical and structural functionality. A heat-sinking slug 10 is placed into an insert-molded leadframe 12. The insert-molded leadframe 12 is a filled plastic material molded around a metal frame that provides an electrical path. The slug 10 may include an optional reflector cup 14. The light-emitting diode (LED) die 16 is mounted directly or indirectly via a thermally conducting sub-mount 18 to the slug 10. Bond wires extend from the LED 16 and the submount 18 to metal leads on leadframe 12 that are electrically and thermally isolated from the slug 10. An optical lens 20 may be added by mounting a pre-molded thermoplastic lens and an encapsulant (not shown) or by casting epoxy to cover the LED or by a cast epoxy lens over the encapsulant (not shown). The encapsulant is preferably a soft material that provides low stress or cushioning to the LED die. Because the LED die is thermally coupled to the heatsinking slug, the die can be maintained at a junction temperature lower than conventional packages. The lower operating temperature maintains reliability and performance under high-power conditions because the die is not subject to high thermal stress.

The heatsinking slug 10 is isolated thermally from the leadframe 12. If an insulating submount 18 is used, then the slug 10 is electrically insulating. Hence, the slug 10 may be attached to an external heat sink (not shown) with minimal thermal resistance to prevent a thermal build-up within the package. The massive slug 10 provides a low thermal resistance path to conduct heat away from the LED die 16. While the preferred embodiment employs a copper slug, other suitable materials include thermally conductive materials such as diamond, silicon, aluminum, molybdenum, aluminum nitride, aluminum oxide, beryllia or composites and alloys thereof. Alternatively, composites of molybdenum-copper and tungsten-copper may be used. Suitable thermally conductive materials include pure materials, compounds, and composites of silver, copper, diamond, silicon, aluminum, tungsten, molybdenum, and beryllium.

The submount 18 provides a thermally conducting path and thermal expansion buffer between the slug material and the LED die. It preferably has a thermal coefficient of expansion comparable to the LED die. The submount 18 may be electrically conducting or insulating. The submount 18 may be made of a thermally conductive material selected from the group consisting of pure materials, compounds, and composites of silver, copper, diamond, silicon, aluminum, tungsten, molybdenum, and beryllium.

The insert-molded leadframe 12 is a patterned metal part that provides high electrical conductivity but only low thermal conductivity. The leadframe may be over-molded by a plastic structural part that provides low thermal conductivity and electrical insulation. The insulating part of the leadframe is a filled plastic material that provides structural integrity. The strong plastic body provides the structural integrity of the package and has hardness on the order of Durometer Shore 50-90 D. Separating the optical and structural functions allows the package to maintain optical quality without compromising its structural integrity.

The encapsulant is a soft optically transparent material having a refractive index>1.3, e.g. silicone, liquid or gelatinous optical compound, and fills the optical path between an LED die 16 and the optical lens 20. The soft optically transparent material protects the LED die 16. The soft encapsulant has a hardness less than Durometer Shore 10 A.

The optional reflector cup 14 may be made of thermally conductive materials that have been plated for reflectivity. The optional reflector cup 14 may be made of thermally conductive materials that have been coated for reflectivity. Similar to the slug 10, suitable thermally conductive materials from which the reflector cup may be composed include materials such as silver, copper, aluminum, molybdenum, diamond, silicon, alumina, aluminum nitride, aluminum oxide, and composites thereof. Unlike the slug, the reflector cup walls may also be made of thermally insulating materials, e.g. plastics with reflective coatings.

Alternatively, the walls may be formed by the un-coated surface of the optical plastic lens shell arranged such that the exterior optical surface presents a reflective surface by Total Internal Reflection CIMR) by virtue of the angle of incidence to the light rays from the chip to the surface and a high to low refraction index step change at the surface. The refraction index step change is≧0.3.

In many preferred embodiments the cup has been coated with silver. Other reflective material coatings may be used such as aluminum, gold, platinum, dielectric coated metals such as aluminum, silver, gold, or pure dielectric stacks.

We claim:

1. A light emitting die assembly comprising:
   metal leads;
   an insulating body attached to the metal leads, the insulating bode having a cavity;
   a heat sink of a first thermally conductive material, the heat sink separate from the metal leads, connected to the insulating body and positioned relative to the cavity for being thermally coupled to a die; and
   a lens, positioned relative to the cavity for transmitting light emitted from the die.

2. An assembly, as defined in claim 1, further including a submount of a second thermally conductive material, connected to the heat sink.

3. An assembly, as defined in claim 2, wherein the second thermally conductive material is selected from the group consisting of pure materials, compounds, and composites of silver, copper, diamond, silicon, aluminum, tungsten, molybdenum, and beryllium.

4. An assembly, as defined in claim 1, wherein the first thermally conductive material is selected from the group consisting of pure materials, compounds, and composites of silver, copper, diamond, silicon, aluminum, tungsten, molybdenum, and beryllium.

5. An assembly as defined in claim 1, further comprising:
   a die thermally coupled to the heat sink.

6. An assembly, as defined in claim 5, further comprising an optically transparent material, encapsulating the die, having a hardness less than Shore 10A.

7. An assembly, as defined in claim 5, further comprising a submount of a second thermally conductive material connected between the die and the heat sink.

8. An assembly, as defined in claim 7, wherein the second thermally conductive material is selected from the group consisting of pure materials, compounds, and composites of silver, copper, diamond, silicon, aluminum, tungsten, molybdenum, and beryllium.

9. An assembly, as defined in claim 5, wherein the first thermally conductive material is selected from the group consisting of pure materials, compounds, and composites of silver, copper, diamond, silicon, aluminum, tungsten, molybdenum, and beryllium.

10. An assembly, as defined in claim 5, further comprising a reflector cup, positioned near the heat sink, having a reflective surface.

11. An assembly, as defined in claim 10, wherein the reflective surface is selected from the group consisting of silver, aluminum, gold, silver with a dielectric coating, gold with a dielectric coating, and aluminum with a dielectric coating.

12. An assembly, as defined in claim 10, wherein the reflective surface includes a dielectric stack.

13. An assembly, as defined in claim 10, wherein the reflective surface includes at least one totally internal reflective surface formed by refractive index step changes>0.3.

14. An assembly, as defined in claim 1, further comprising a reflector cup, positioned near the heat sink having a reflective surface.

15. An assembly, as defined in claim 14, wherein the reflective surface is selected from the group consisting of silver, aluminum, gold, silver with a dielectric coating, gold with a dielectric coating, and aluminum with a dielectric coating.

16. An assembly, as defined in claim 14, wherein the reflective surface includes a dielectric stack.

17. An assemble, as defined in claim 14, wherein the reflective surface includes at least one totally internal reflective surface formed by refractive index step changes>0.3.

18. An assembly, as defined in claim 17, wherein the reflector cup includes a material selected from the group consisting of silver, copper, aluminum, molybdenum, diamond, silicon, alumina, aluminum nitride, aluminum oxide, and composites of silver, copper, aluminum, molybdenum, diamond, silicon, alumina, aluminum nitride, and aluminum oxide.

19. An assembly, as defined in claim 17, wherein the reflector cup includes a thermally insulating material.

20. An assembly, as defined in claim 10, wherein the reflector cup includes a material selected from the group consisting of silver, copper, aluminum, molybdenum, diamond, silicon, alumina, aluminum nitride, aluminum oxide, and composites of silver, copper, aluminum, molybdenum, diamond, silicon, alumina, aluminum nitride, and aluminum oxide.

21. An assembly, as defined in claim 10, wherein the reflector cup includes a thermally insulating material.

22. A light emitting die assembly comprising:
   metal leads;
   an insulating body attached to the metal leads, the insulating body having a cavity; and
   a heat sink of a first thermally conductive material, the heat sink separate from the metal leads, connected to the insulating body, and positioned relative to the cavity for being thermally coupled to a die.

23. The assembly of claim 22, further including a submount of a second thermally conductive material, connected to the heat sink.

24. The assembly of claim 22, wherein the first and second thermally conductive materials are selected from the group consisting of pure materials, compounds, and composites of silver, copper, diamond, silicon, aluminum, tungsten, molybdenum, and beryllium.

25. The assembly of claim 22, further comprising a reflector cup positioned near the heat sink, having a reflective surface.

26. The assembly of claim 25, wherein the reflective surface is selected from the group consisting of silver, aluminum, gold, silver with a dielectric coating, gold with a dielectric coating, and aluminum with a dielectric coating.

27. The assembly of claim 25, wherein the reflective surface includes a dielectric stack.

28. The assembly of claim 25, wherein the reflective surface includes at least one totally internal reflective surface formed by refractive index step changes $\geq 0.3$.

* * * * *

US006274924C1

(12) EX PARTE REEXAMINATION CERTIFICATE (9867th)
United States Patent
Carey et al.

(10) Number: US 6,274,924 C1
(45) Certificate Issued: Oct. 11, 2013

(54) SURFACE MOUNTABLE LED PACKAGE

(75) Inventors: Julian A. Carey, Sunnyvale, CA (US); William D. Collins, III, San Jose, CA (US); Ban Poh Loh, San Jose, CA (US); Gary D. Sasser, San Jose, CA (US)

(73) Assignee: Philips Lumileds Lighting Company LLC, San Jose, CA (US)

Reexamination Request:
No. 90/011,886, Sep. 19, 2011

Reexamination Certificate for:
Patent No.: 6,274,924
Issued: Aug. 14, 2001
Appl. No.: 09/187,547
Filed: Nov. 5, 1998

(51) Int. Cl.
*H01L 33/00* (2010.01)

(52) U.S. Cl.
USPC ............ 257/676; 257/98; 257/E33.072

(58) Field of Classification Search
None
See application file for complete search history.

(56) References Cited

To view the complete listing of prior art documents cited during the proceeding for Reexamination Control Number 90/011,886, please refer to the USPTO's public Patent Application Information Retrieval (PAIR) system under the Display References tab.

*Primary Examiner* — Leonardo Andujar

(57) ABSTRACT

An LED package includes a heat-sinking slug that is inserted into an insert-molded leadframe. The slug may include an optional reflector cup. Within this cup, the LED and a thermally conducting sub-mount may be attached. Wire bonds extend from the LEDs to metal leads. The metal leads are electrically and thermally isolated from the slug. An optical lens may be added by mounting a pre-molded thermoplastic lens and a soft encapsulant or by casting epoxy to cover the LED or by a cast epoxy lens over a soft encapsulant.

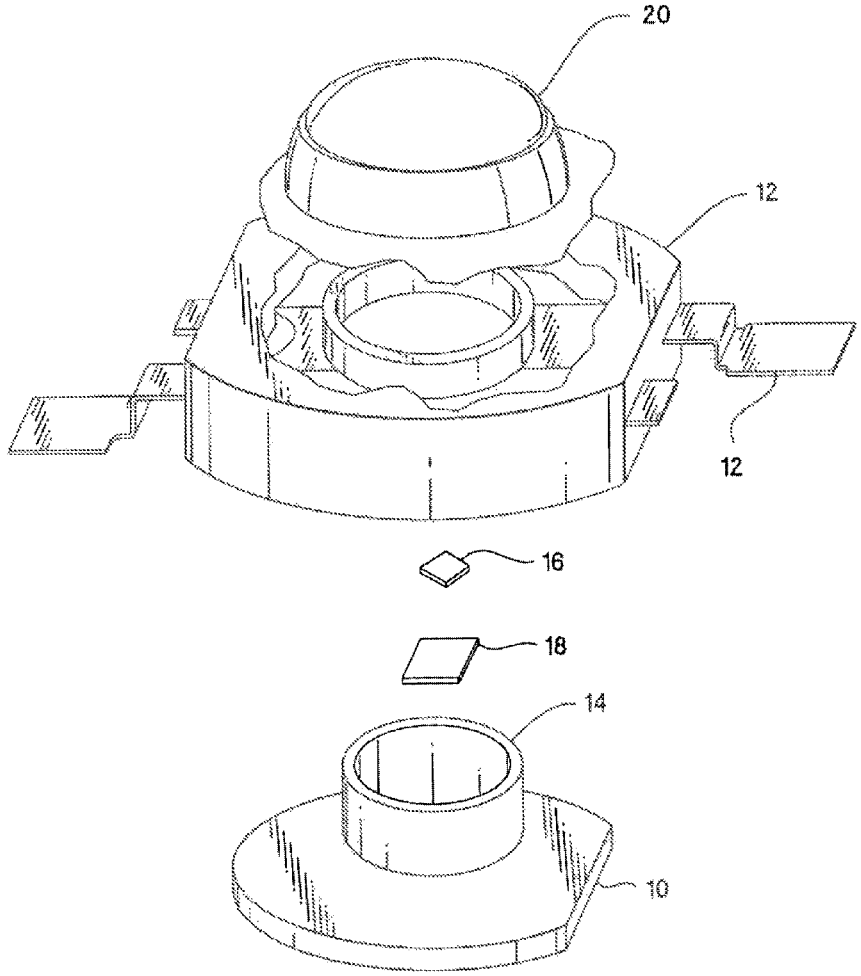

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 22-28 are cancelled.

Claim 1 is determined to be patentable as amended.

Claims 2-21, dependent on an amended claim, are determined to be patentable.

1. A light emitting *diode (LED)* die assembly *that has decoupled optical and structural functionality*, comprising:

metal leads;

an insulating body *formed of a filled plastic material* attached to the metal leads, the insulating [bode] *body* having a cavity;

a heat sink of a first thermally conductive material, the heat sink separate from the metal leads, connected to the insulating body and positioned relative to the cavity for being thermally coupled to a die; [and]

a lens, *structurally decoupled from the insulating body and forming an outermost surface of the assembly,* positioned relative to the cavity for transmitting light emitted from the die; *and*

*a soft, optically transparent material filling the optical path between the lens and the die.*

* * * * *